United States Patent [19]

Seely

[11] 4,355,421

[45] Oct. 19, 1982

[54] BROADBAND MIXER WITH COPLANAR BALUN

[75] Inventor: Warren L. Seely, Aurora, Colo.

[73] Assignee: Vari-L Company, Inc., Denver, Colo.

[21] Appl. No.: 213,204

[22] Filed: Dec. 5, 1980

[51] Int. Cl.³ .............................................. H04B 1/26
[52] U.S. Cl. ......................................... 455/327; 455/330; 333/26
[58] Field of Search ............................ 455/325–328, 455/330; 333/26, 238, 4, 136

[56] References Cited

U.S. PATENT DOCUMENTS

| | | | |
|---|---|---|---|
| 3,772,599 | 11/1973 | Ernst | 455/327 |
| 4,063,176 | 12/1977 | Milligan et al. | 455/326 |
| 4,125,810 | 11/1978 | Pavio | 455/327 |
| 4,224,572 | 9/1980 | Will | 455/326 |

Primary Examiner—Jin F. Ng
Attorney, Agent, or Firm—Ancel W. Lewis, Jr.

[57] ABSTRACT

An improved broadband mixer includes a first balun (11) with a first signal port (12), a second balun (14) with a second signal port (15), a third balun (17) with a third signal port (18), and a frequency converter (19) coupled between the first, second, and baluns. The first balun means, which preferably receives an RF signal via said first signal port, includes two juxtaposed ground plane baluns 31 and 32 each having opposed, spaced, strip conductors in different planes. The second balun, which preferably receives an LO signal via the second signal port, has a coplanar balun (44) including three strip conductors in the same plane which in turn connects to two juxtaposed ground plane baluns (45 and 46) each having opposed, parallel spaced, strip conductors. The combination of the coplanar balun (44) with the two ground plane baluns (45 and 46) establishes signal polarities which merge end to end with the opposite ground plane baluns (31 and 32) to prevent signals from passing from one signal port to the opposite signal port without requiring cross-connections between the strip conductors in different planes opposite the ground plane baluns.

15 Claims, 4 Drawing Figures

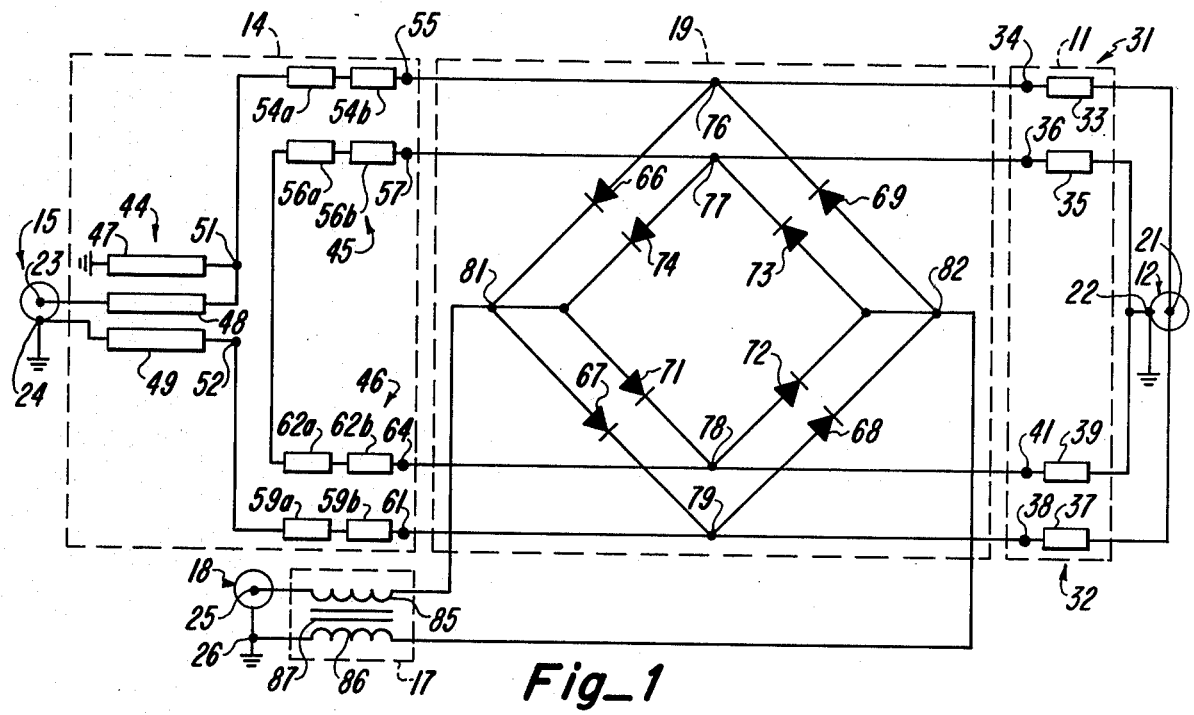
Fig_1
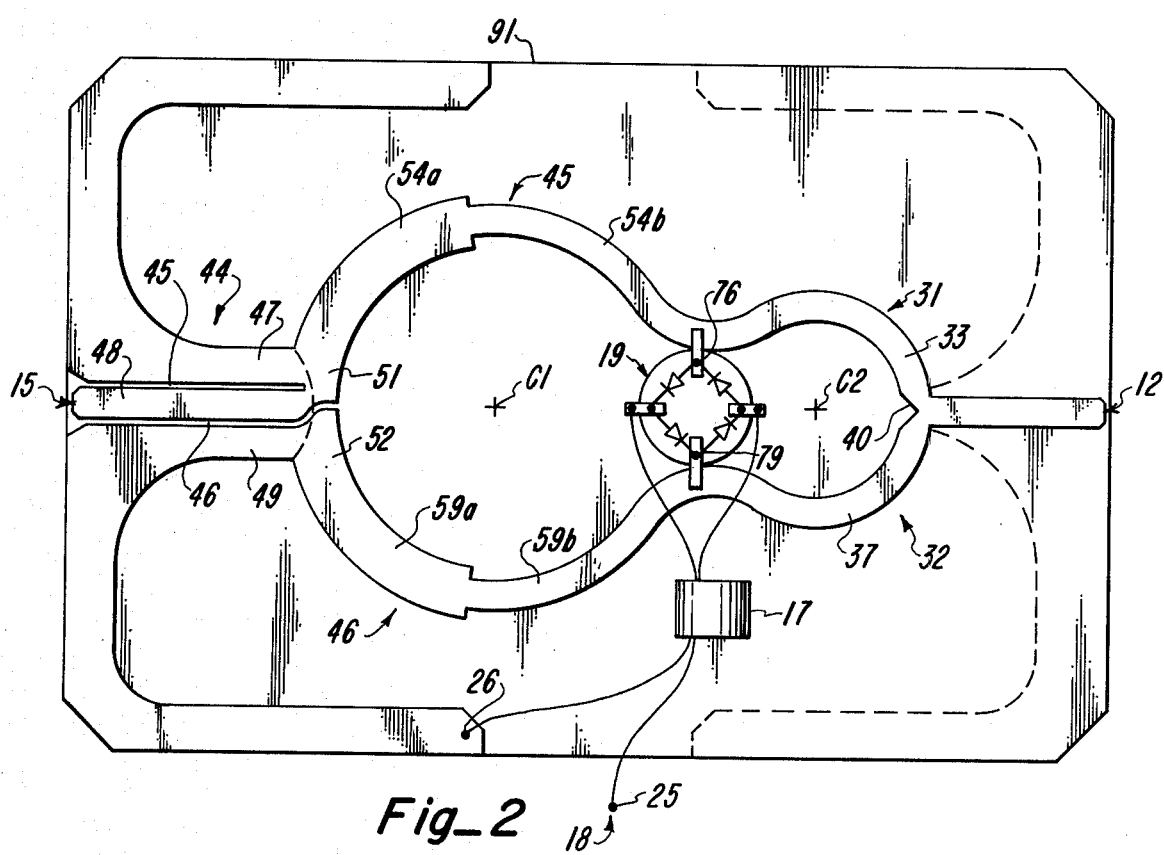
Fig_2

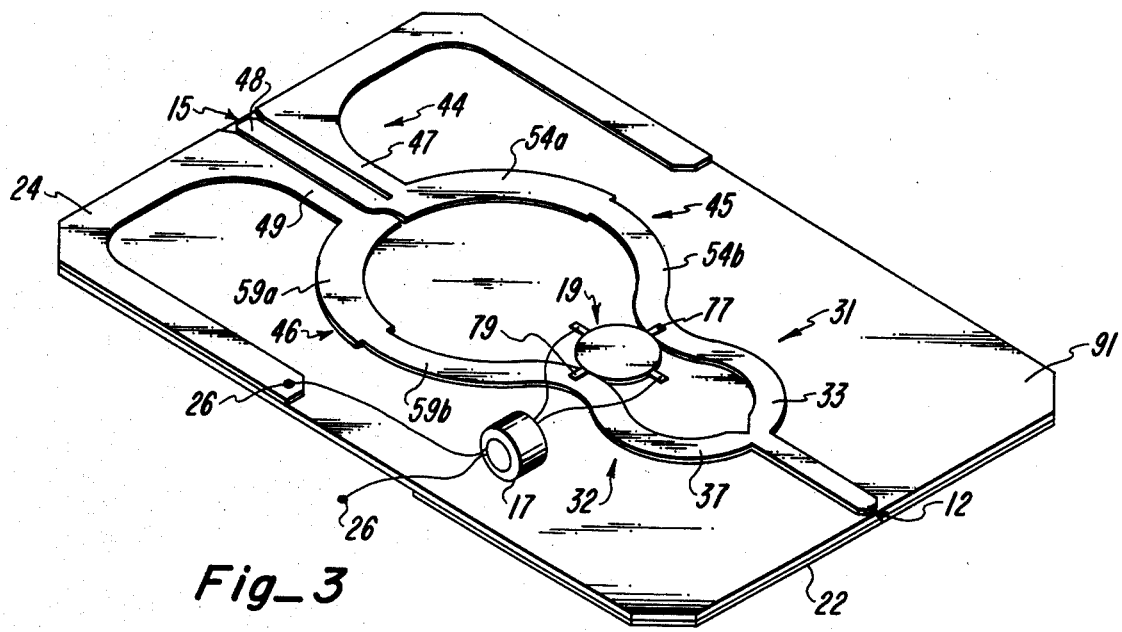
Fig_3
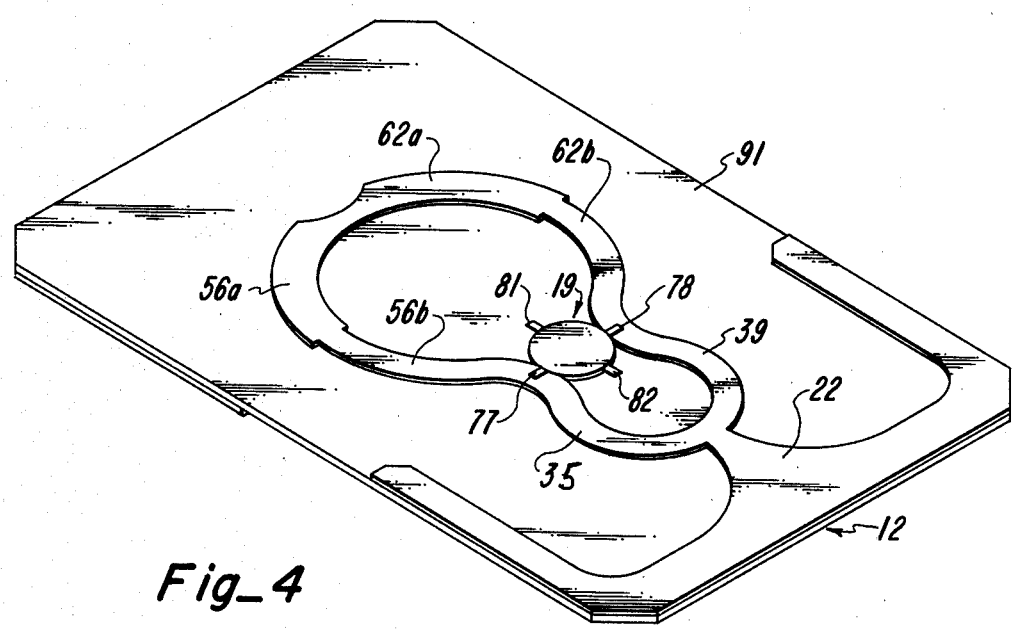
Fig_4

4,355,421

BROADBAND MIXER WITH COPLANAR BALUN

TECHNICAL FIELD

This invention relates to a novel and improved high frequency broadband mixer.

BACKGROUND ART

In U.S. Pat. No. 4,063,176, assigned to the assignee of the present invention, there is disclosed a high frequency broadband mixer having a balun arrangement with each of two signal ports having a pair of ground plane strip conductor baluns and a single dielectric substrate, together with a frequency converter connected between said baluns. In using this type of balun it was necessary to terminate the strip conductors for each balun at the frequency converter and use cross-over connections between the strip conductors in different planes to provide signal polarities that will convert from unbalanced to balanced signals and at the same time isolate the two signal ports that receive RF and LO signals from one another.

DISCLOSURE OF INVENTION

In accordance with the present invention there is provided a coplanar balun inclusive of three relatively narrow strip conductors on a single dielectric substrate connected between two ground plane baluns at one signal port, preferably the LO port, which together provide a balun arrangement that is characterized by single continuous strip conductors extending between LO and RF signal ports and eliminates the necessity of cross-over connections between the strip conductors of the baluns associated with different signal ports.

BRIEF DESCRIPTION OF DRAWINGS

The details of this invention will be described in connection with the accompanying drawings, in which:

FIG. 1 is a schematic circuit diagram of an electronic broadband mixer using a coplanar balun embodying features of the present invention;

FIG. 2 is a top plan view showing a preferred construction of the mixer of FIG. 1;

FIG. 3 is a top perspective view of the mixer construction shown in FIG. 2; and

FIG. 4 is a bottom perspective view of the mixer shown in FIG. 2 that has been rotated 180° about its longitudinal axis from the disposition shown in FIG. 3.

DETAILED DESCRIPTION

Referring now to FIG. 1, the electronic broadband mixer shown, in general, comprises a first balun means 11 having a first signal port 12, a second balun means 14 having a second signal port 15, and a third balun means 17 having a third signal port 18, together with a frequency converter 19 connected between the three balun means and the signal ports.

In the electronic broadband mixer described herein the first signal port 12 is particularly suited for having an RF signal applied thereto and is also referred to herein as the RF port. The second signal port 15 is particularly suited for having an LO signal applied thereto and is also referred to as the LO port. The third signal port 18, in response to the above designated RF and LO signals applied to ports 12 and 15, produces an IF signal and is also referred to herein as the IF port. However, it is understood that each of the three ports, 12, 15 and 18 is mutually interchangeable and each may output or input a signal. The third port 18 is also sometimes referred to in the art as the X port.

For the purposes of identification and explanation, the RF port 12 is shown as having terminals 21 and 22 with terminal 22 being connected to ground, the 10 port 15 is shown to have a pair of terminals 23 and 24 with terminal 24 being connected to ground, and the IF port 18 has terminals 25 and 26 with terminal 26 being connected to ground.

More specifically, the balun means 11 includes two laterally spaced or juxtaposed ground plane baluns 31 and 32. Balun 31 has a top strip conductor 33 having one end forming terminal 21 and defining an output terminal 34 at the opposite end, together with a ground plane in the form of a bottom strip conductor 35 having one end connected to ground terminal 22 and an output terminal 36 at the opposite end. Generally stated in the operation of balun 31, when an RF signal is applied to RF port 12 a first output signal is produced across the pair of terminals 34 and 36.

In describing the embodiment chosen for illustrating the present invention, the terms "tops" and "bottom" are used for identification purposes only and have no limiting significance since it is apparent that the circuit would work as well if the conductors were on either a top or a bottom location on the dielectric substrate 91 described hereinafter.

Balun 32 has a top strip conductor 37 having one end forming terminal 21 and an output terminal 38 at the opposite end together with a ground plane in the form of a bottom strip conductor 39 having one end connected to ground terminal 22 and an output terminal 41 at the opposite end. During the operation of balun 32 a second output signal is produced across the pair of terminals 38 and 41 when an RF signal is applied to RF port 12.

The balun means 14 at the LO port 15 includes a coplanar balun 44 which in turn is connected to two laterally spaced or juxtaposed ground plane baluns 45 and 46. Balun 44 has three, relatively narrow, coplanar, juxtaposed top strip conductors 47, 48 and 49. Each of these conductors 47, 48 and 49 is of equal length and is λ/4 (quarter wavelength) at logarithmic center frequency. In the circuit, center strip conductor 48 has one end forming terminal 23 and the opposite end connected to an adjacent end of conductor 47 at a terminal designated by numeral 51. The other end of conductor 47 adjacent terminal 23 is connected to ground. Conductor 49 has one end adjacent terminal 23 connected to ground at terminal 24 and the opposite end is a terminal designated by numeral 52.

Ground plane balun 45 includes top strip conductor segments 54a and 54b arranged end to end having one end of segment 54a connected to terminal 51 and an output terminal 55 at the opposite end of segment 54b, together with a ground plane in the form of bottom strip conductor segments 56a and 56b arranged end to end having an output terminal 57 at one end adjacent terminal 55 with terminals 55 and 57 being a pair of output terminals for balun 45.

Similarly, ground plane balun 46 has top strip conductor segments 59a and 59b arranged end to end having one end of segment 59a connected to terminal 52 and an output terminal 61 at the opposite end of segment 59b together with a ground plane in the form of bottom strip conductor segments 62a and 62b arranged end to end having an output terminal 64 at one end and the other end is connected to conductor segment 56a of the laterally spaced balun 45. Terminals 61 and 64 are one pair of output terminals for balun 46 across which an output signal is generated, as described hereinafter.

The frequency converter 19 is a double star arrangement of non-linear devices arranged as a group of four unidirectional devices and specifically diodes 66, 67, 68 and 69 poled in the same direction in an outer ring and a group of four diodes 71, 72, 73 and 74 poled in the same direction in an inner ring. The diodes are further identified as operating pair 66, 67, pair 72, 73, pair 74, 71, and pair 68, 69. The diodes have two sets of input terminals formed at the connection of the diodes, one set of input terminals being designated by numerals 76 and 77 and the other set of input terminals designated by numerals 78 and 79. A single set of output terminals from the inner and outer rings of diodes is designated by numerals 81 and 82.

In the circuit shown, the output of the balun means 11 is coupled to the frequency converter 19 by having the pair of output terminals 34 and 36 connected to terminals 76 and 77, respectively, and the pair of output terminals 41 and 38 connected to terminals 78 and 79, respectively. The output of the balun means 14 is coupled to the frequency converter 19 by having the pair of output terminals 55 and 57 connected to terminals 76 and 77, respectively, and output terminals 64 and 61 connected to input terminals 78 and 79, respectively. As between balun means 11 and 14, these connections therefore connect LO output terminal 55 to RF output terminal 34, LO output terminal 57 to RF output terminal 36, LO output terminal 64 to RF output terminal 41, and LO output terminal 61 to RF output terminal 38.

The third balun means 17 is in the form of a transformer having one winding 85 connected between terminal 81 and terminal 25 of signal port 18, while the other winding 86 is connected between output terminal 82 and ground at signal port 26. Windings 85 and 86 are inductively coupled by a core 87.

Referring now to FIGS. 2–4, a preferred construction and arrangement of the circuit components for the mixer above described includes a single suspended dielectric substrate or dielectric sheet 91 of generally rectangular shape with smooth flat top and bottom faces. The strip conductors are made as thin, narrow strips of a metal conductive foil bonded on the top and bottom faces of the dielectric sheet 91.

Referring now to the coplanar balun 44, coplanar strip conductors 47, 48 and 49 are on the top face of sheet 91 and strip conductors 47 and 48 are separated by air gap 45 and strip conductors 48 and 49 are separated by air gap 46. These air gaps are of equal width and the width of these air gaps is uniform throughout their lengthwise extent.

A length of metal foil extends from metal foil strip conductor 47 along the end and along the edge of the substrate parallel to and spaced from conductor 47 to form the ground for that end. Similarly, a length of foil of a selected width extends from the strip conductor 49 along the end of the substrate and along an outer edge parallel to and spaced from strip conductor 49 to form ground 24 for that end. The considerable air space between the strip conductors 47 and 49 and the metal foil that extends parallel thereto forming the ground is a feature making the balun one that is commonly referred to as a reduced ground plane balun.

Proceeding from left to right in FIGS. 2 and 3, the ground plane balun 45 is provided by using an arcuate or arc-shaped strip conductor segment 54a and an arcuate strip conductor segment 54b made as a thin, narrow strip of metal foil on the top face of the substrate 91 and along a common radius having a center designated Cl. Each of segments 54a and 54b is of substantially uniform width with segment 54a wider than segment 54b to give different impedance characteristics. Each of the segments 54a and 54b forms baluns having a quarter wavelength characteristic. Conductor segments 54a and 54b have one end of segment 54a merging with the adjacent ends of coplanar conductors 47 and 48 defining terminal 51 at their merged ends, together with an arcuate bottom conductor segment 56a opposite segment 54a and segment 56b opposite segment 54b formed on the bottom face of the substrate 91 so as to be in different planes and having the same center Cl.

Ground plane balun 46 is provided by an arcuate or arc-shaped strip conductor segment 59a laterally spaced from or juxtaposed to and spaced from conductor segment 54a and formed along the same radius with a center at Cl. Strip conductor segments 59a and 59b have one end of segment 59a merging with an adjacent end of conductor 49 at terminal 52 with conductor 59b laterally spaced from or juxtaposed to and spaced from conductor 54b along the same radius Cl.

As with balun 45, balun 46 has each of segments 59a and 59b of substantially uniform width throughout its lengthwise extent, segment 59a being wider than segment 59b. Each of segments 59a and 59b forms baluns having a quarter wavelength characteristic. Further, the laterally spaced balun segments 54a and 59a are of a corresponding size and shape and are essentially mirror images relative to a longitudinal center line through the substrate 91. This is also true of segments 54b and 59b with respect to one another.

Balun 46 further has an arcuate or arc-shaped strip conductor segment 62a on the bottom face of the substrate opposite conductor segment 59a and an arcuate strip conductor segment 62b on the opposite face of the substrate opposite conductor segment 59b with a center at Cl but in different planes than segments 59a and 59b.

RF balun 31 has a top strip conductor 33 formed on the top face of the substrate 91 to make it coplanar with conductor segments 54a and 54b of the LO balun along a radius C2 so as to be arcuate or arc-shaped. One end of conductor 33 which forms terminal 34 and is connected to converter 19 at terminal 76 is merged with the end of conductor 54b of the LO balun at terminal 34 so that 54a, 54b and 33 are a single continuous strip between ports 12 and 15. The RF balun further has a top strip conductor 37 on the top face of the substrate 91 formed along the same radius about center C2 and juxtaposed thereto in a spaced relation, and strip conductors 33 and 37 merge and a V-shaped notch 40 is formed therein.

One end of strip conductor 37 is merged with one end of strip conductor 59b at their connection to converter 19 at terminal 79 so that lines 59a, 59b and 37 are a single continuous strip extending lengthwise of the substrate between the ports 12 and 15. The terminal 21 common to juxtaposed ends of top strip conductors 33 and 37 at the RF port 12 is provided by a strip of conductor extending from a common connection to approximately the end of the substrate and is disposed along the longitudinal center line of the substrate parallel to and spaced from the bottom strip conductors 35 and 39, so that baluns 31 and 32 are also reduced ground plane baluns.

Top strip conductor 33 has an oppositely disposed arcuate bottom strip conductor 35 of a corresponding size and shape on the bottom face of the substrate and top strip conductor 37 has an oppositely disposed arcuate bottom strip conductor 39 on the opposite side of the substrate.

Bottom strip conductors 35 and 39 are connected to the ground conductor 22 formed as strips of metal foil extending along the ends and the outer sides of the substrate, as best seen in FIG. 4. Moreover, bottom strip conductors 62a, 62b and 39 are a single continuous strip extending along one side of the longitudinal center line of the substrate, while bottom strip conductors 56a, 56b and 34 are a single continuous strip extending along an opposite side of the center line of the substrate between ports 12 and 15, as best seen in FIG. 4.

The strip conductors of baluns 31 and 32 are of uniform width throughout their length and are the same width as strip conductors 54b, 55b, 62b and 59b. Baluns 31 and 32 have a quarter wavelength characteristic. The arcuate shape of the strip conductors on both sides provides a convenience for design and manufacture and the spacing between adjacent or juxtaposed strip conductors electrically isolates one from the other.

The IF balun 17 is shown in FIGS. 2 and 3 as mounted on the top face of the substrate.

OPERATION

A full sequence of operation for the above described mixer will now be described by considering the application of the RF input signal and the LO input signal to ports 12 and 15, respectively.

RF INPUT SIGNAL

Generally stated, when an RF signal is applied to the RF port 12, the RF power is equally divided and applied to the strip conductor pairs 33 and 35 and to strip conductor pairs 37 and 39. The RF power is transformed from an unbalanced signal to two balanced output signals across the pair of terminals 76 and 77 and across the pair of terminals 78 and 79.

Considering now the polarity, if for example a voltage of +2E is applied to the RF port 12, this voltage is divided and a +E voltage appears at terminals 34 and 38 which are connected to terminals 76 and 79, respectively, placing a voltage of +E on terminals 55 and 61 on the LO side. This +E voltage transfers through baluns 45 and 46 to a +E at terminals 51 and 52, which in turn transfers through balun 44 as a zero potential or ground at LO port 15 to isolate the LO port from the RF signal. This is because the application of a signal of like polarity and amplitude to a pair of terminals on one side of the balun results in a canceling of the signals at the terminals on the opposite side of the balun due to the operation of the balun.

In the operation of baluns 44, 45 and 46, the ground or zero potential to RF power at LO port 15 is transferred back through balun 44 (quarter wavelength) as an open at terminals 51 and 52, a ground between the conductor segments of each of baluns 45 and 46 and an open at terminals 55 and 57, and an open at terminals 61 and 64, as is required for the operation of converter 19. Note that, because each conductor segment of baluns 45 and 46 is one fourth wavelength, these baluns have a half wavelength characteristic. Therefore, all RF power is delivered to terminals 76, 77 and terminals 78, 79, as is required.

With the diode arrangement shown in the converter 19, the RF signal is applied across the diode pairs biased on by the LO signal, which are pair 66, 67 and pair 72, 73 alternated with pair 74, 71 and pair 68, 69. Since the RF signal applied to the diodes is a balanced signal, the RF signal present at terminals 81 and 82 is equal in magnitude and size. These signals pass through balun 17 to provide a ground or zero potential at port 18 to effectively isolate port 18 from the RF signal.

LO INPUT SIGNAL

When an LO signal is applied to the LO signal port 15, this signal is transformed from an unbalanced signal to a balanced signal at terminals 51 and 52. The balanced signal at terminals 51 and 52 is transferred to two balanced output signals at terminal pairs 55, 57 and at terminal pairs 61, 64. In the operation of the baluns 45 and 46 the current in opposite directions in strip conductor segments 56a and 62a provides a zero potential at the common connection between these two segments. This zero potential at the common ends of segments 56a and 62a provides an unbalanced to balanced signal between this common connection and each of terminals 55, 57, 61 and 64.

If, for example, a voltage of +2E is applied to the LO port, this voltage is divided and a +E voltage and a −E voltage appears at terminals 51 and 52, respectively. This provides a +E voltage at terminal 55 and a −E voltage at terminal 61. A −E voltage at terminal 61 which is connected to terminal 38 and a +E voltage at terminal 55 which is connected to terminal 34 pass through the RF baluns 31 and 32 and cancel at terminal 21 to provide a ground or zero potential at 21. Similarly, terminals 36 and 41 are −E and +E and these cancel out to provide a ground 22 which is also a real ground, so that this balun arrangement isolates the LO signal from port 12.

The ground or zero potential to LO power at the RF port 12 transfers back through baluns 31 and 32 (quarter wavelength) to opens at terminals 76 and 77 and terminals 78 and 79, as is required.

With the diode arrangement shown in converter 19, the LO signal will alternately turn on diode pair 66, 67, pair 72, 73, pair 74, 71, and pair 68, 69, as above described. This sequence for the diodes results in a ground or zero potential at terminals 81 and 82, providing an isolation of port 18 from the LO signal.

The above described apparatus therefore eliminates the necessity of breaking the strip conductors at the frequency converting end and cross-connecting conductors in different planes. The structure above described is easier and less expensive to manufacture and extends the upper end frequency response to above 20 GHz.

Although the present invention has been described with a certain degree of particularity, it is understood that the present disclosure has been made by way of example and that changes in details of structure may be made without departing from the spirit thereof.

What is claimed is:

1. In a broadband mixer having first, second and third balun means coupled between first, second and third signal ports and frequency converting means,
    said frequency converting means arranged to convert first and second signals applied to said first and second signal ports, respectively, to a third signal at said third signal port, said first balun means incuding first and second ground plane baluns juxtaposed to one another, each of said first and second ground plane baluns having a pair of opposed, spaced, strip conductors disposed in different planes, said second balun means including third and fourth ground plane baluns juxtaposed to one another, each of said third and fourth ground plane baluns having a pair of opposed, spaced, strip conductors disposed in different planes, the improvement wherein:

said second balun means includes a coplanar balun coupled between said second signal port and said third and fourth ground plane baluns, said coplanar balun having a center and two side coplanar strip conductors spaced from one another for converting an unbalanced input signal applied to said second signal port to two balanced output signals, one end of said center conductor having a first terminal, the other end of said center conductor being connected to an adjacent end of one of said side conductors having a second terminal, an end of said other side conductor adjacent said second terminal having a third terminal, the ends of said side conductors opposite said second and third terminals being connected to ground, said two balanced output signals appearing at said second and third terminals when said unbalanced input signal is applied to said first terminal.

2. In a broadband mixer as set forth in claim 1 wherein said two balanced output signals from said coplanar balun are of a substantially equal amplitude and of opposite polarity.

3. In a broadband mixer as set forth in claim 1 wherein said three strip conductors of said coplanar balun means are of a length of one fourth wavelength at logarithmic center frequency.

4. In a broadband mixer as set forth in claim 1 wherein said strip conductors of said first and second ground plane baluns are shaped as arcs that are arranged about a common center.

5. In a broadband mixer as set forth in claim 1 wherein said frequency converting means includes two groups of unidirectional devices arranged as two rings of diodes with four diodes per ring and the diodes in each ring are poled in the same direction, said diodes being connected as sets of diodes between pairs of input and output terminals for said frequency converting means.

6. In a broadband mixer as set forth in claim 5 wherein said frequency converting means includes unidirectional devices connected to electrically isolate first and second signals at said first and second signal ports from said third signal port.

7. In a broadband mixer hving first, second and third balun means coupled between first, second and third signal ports and frequency converting means, said frequency converting means arranged to convert first and second signals applied to said first and second signal ports, respectively, to a third signal at said third signal port, said first balun means including first and second ground plane baluns juxtaposed to one another, each of said first and second ground plane baluns having a pair of opposed, spaced, strip conductors disposed in different planes, said second balun means including third and fourth ground plane baluns juxtaposed to one another, each of said third and fourth ground plane baluns having a pair of opposed, spaced, strip conductors disposed in different planes, the improvement wherein:

said second balun means includes a coplanar balun coupled between said second signal port and said third and fourth ground plane baluns, said coplanar balun having three coplanar strip conductors spaced from one another for converting an unbalanced input signal applied to said second signal port to two balanced output signals, one strip conductor of said first ground plane balun is disposed end to end to one strip conductor of said third ground plane balun with said one strip conductors being merged at adjacent ends to form a single continuous strip extending between said first and second signal ports on one face of a dielectric sheet.

8. In a broadband mixer as set forth in claim 7 wherein the strip conductors of said third and fourth ground plane baluns are formed as two strip conductor segments connected end to end, each of a length of one fourth wavelength at logarithmic center frequency.

9. In a broadband mixer as set forth in claim 7 wherein said strip conductors of said third and fourth ground plane baluns are shaped as arcs that are arranged about a common center.

10. In a broadband mixer as set forth in claim 7 wherein the other strip conductor of said first ground plane balun is disposed end to end to the other strip conductor of said third ground plane balun with said other strip conductors being merged at adjacent ends to form a single continuous strip extending between said first and second signal ports on the other face of said dielectric sheet.

11. In a broadband mixer as set forth in claim 7 wherein one strip conductor of said second ground plane balun is disposed end to end to one strip conductor of said fourth ground plane balun with said one strip conductors being merged at adjacent ends to form a single continuous strip extending between said first and second signal ports on one face of said dielectric substrate.

12. In a broadband mixer as set forth in claim 11 wherein the other strip conductor of said second ground plane balun is disposed end to end to the other strip conductor of said fourth ground plane balun with said other strip conductors being merged at adjacent ends to form a single continuous strip extending between said first and second signal ports on said other face of said dielectric sheet.

13. In a broadband mixer having first, second and third balun means coupled between first, second and third signal ports and frequency converting means, said frequency converting means arranged to convert first and second signals applied to said first and second signal ports, respectively, to a third signal at said third signal port, said first balun means including first and second ground plane baluns juxtaposed to one another, each of said first and second ground plane baluns having a pair of opposed, spaced, strip conductors disposed in different planes, said second balun means including third and fourth ground plane baluns juxtaposed to one another, each of said third and fourth ground plane baluns having a pair of opposed, spaced, strip conductors disposed in different planes, the improvement wherein:

said second balun means includes a coplanar balun coupled between said second signal port and said third and fourth ground plane baluns, said coplanar balun having three coplanar strip conductors spaced from one another for converting an unbalanced input signal applied to said second signal port to two balanced output signals, one strip conductor of said first ground plane balun and one strip conductor of said second ground plane balun being disposed end to end to one strip conductor of said third and fourth ground plane baluns, respectively, with end to end of said one strip conductors being merged at adjacent ends to form a pair of laterally spaced single cntinuous strips extending between said first and second signal ports on one face of a dielectric sheet, the other strip conductor of said first ground plane balun and the other strip conductor of said second ground plane balun being disposed end to end to the other strip conductor of said third and fourth ground plane baluns, respectively, with end to end of said other strip conductors being merged at adjacent ends to form a pair of laterally spaced single continuous strips extending between said first and second signal ports on the other face of said dielectric sheet.

14. In a broadband mixer as set forth in claim 13 wherein adjacent ends of the other of said strip conductors of said third and fourth ground plane baluns are connected together at a common connection whereby the application of a balanced signal to said third and fourth baluns via said second signal port produces a zero potential at said common connection to provide an unbalanced signal between each of a pair of output terminals of said third balun and each of a pair of output terminals of said fourth balun to effect the isolation of said second port from a signal applied to said first port by producing a zero potential at said second port which is transferred back to said output terminals as an open by the operation of said third and fourth ground plane baluns.

15. A broadband mixer comprising:

first balun means having a first signal port for converting an unbalanced first input signal applied to said first signal port to balanced first and second output signals;

second balun means having a second signal port including a coplanar balun coupled to the second signal port and a pair of ground plane baluns coupled to said coplanar balun for converting an unbalanced second input signal applied to said second signal port to balanced third and fourth output signals, said second balun means including a coplanar balun coupled between said second signal port and said third and fourth ground plane baluns, said coplanar balun having three coplanar strip conductors spaced from one another for converting an unbalanced input signal applied to said second signal port to two balanced output signals;

third balun means having a third signal port; and frequency converting means having at least a first set of terminals and a second set of terminals to which are applied said balanced first and second output signals and said balanced third and fourth output signals and a third set of terminals, said frequency converting means including an arrangement of non-linear devices associated with said first, second, and third sets of terminals for converting said balanced first and second output signals to a balanced third output signal at said third set of terminals that is conducted via said third balun means to produce an unbalanced third signal at said third signal port, said non-linear devices electrically isolating first and second signals at said first and second signal ports from said third signal port.

* * * * *

Dedication 4,355,421.—*Joseph W. Modia* and *James McCarthy, III*, Fort Wayne, Ind. LIGHT FIXTURE, LIGHT APERTURE AND METHOD OF UNIFORMLY ILLUMINATING AN OPTICALLY DIFFUSIVE VIEWING AREA. Patent dated June 15, 1982. Dedication filed Sept. 27, 1984, by the assignee, *The Huey Co., Inc.*

Hereby dedicates to the public the entire remaining term of said patent.
[*Official Gazette December 4, 1984.*]